United States Patent
Yeo et al.

(10) Patent No.: US 11,004,903 B2
(45) Date of Patent: May 11, 2021

(54) ELECTRONIC DEVICE HAVING HEXAGONAL STRUCTURE AND ADDRESSING METHOD THEREFOR

(71) Applicant: INDUSTRY-ACADEMIC COOPERATION FOUNDATION, YONSEI UNIVERSITY, Seoul (KR)

(72) Inventors: Jong Souk Yeo, Incheon (KR); Deok Jin Jeon, Incheon (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 16/408,588

(22) Filed: May 10, 2019

(65) Prior Publication Data

US 2019/0348467 A1   Nov. 14, 2019

(30) Foreign Application Priority Data

May 14, 2018   (KR) .................... 10-2018-0054826

(51) Int. Cl.
*G11C 11/00* (2006.01)
*H01L 27/24* (2006.01)
*H01L 23/528* (2006.01)
*H01L 45/00* (2006.01)
*G11C 13/00* (2006.01)

(52) U.S. Cl.
CPC ...... *H01L 27/2481* (2013.01); *G11C 13/0004* (2013.01); *G11C 13/0026* (2013.01); *G11C 13/0028* (2013.01); *H01L 23/528* (2013.01); *H01L 27/2418* (2013.01); *H01L 27/2427* (2013.01); *H01L 45/06* (2013.01); *H01L 45/1233* (2013.01); *H01L 45/144* (2013.01); *G11C 2213/71* (2013.01); *G11C 2213/72* (2013.01); *H01L 45/085* (2013.01); *H01L 45/146* (2013.01)

(58) Field of Classification Search
CPC ............... H01L 27/2481; H01L 23/528; H01L 27/2418; H01L 27/2427; H01L 45/06; G11C 13/0004; G11C 13/0026; G11C 13/0028
USPC .......................................... 365/163
See application file for complete search history.

(56) References Cited

U.S. PATENT DOCUMENTS

| 10,454,028 | B2 * | 10/2019 | Park .................. H01L 43/08 |
| 2005/0280150 | A1 * | 12/2005 | Farrar ................. B82Y 10/00 257/734 |

FOREIGN PATENT DOCUMENTS

| KR | 10-2013-0107326 A | 10/2013 |
| KR | 10-2018-0015402 A | 2/2018 |

* cited by examiner

*Primary Examiner* — Huan Hoang
(74) *Attorney, Agent, or Firm* — Sughrue Mion, PLLC

(57) ABSTRACT

The present disclosure discloses an electronic device having a hexagonal structure and an addressing method therefor. The electronic device according to one embodiment of the present disclosure includes a first conductor arranged in a first direction, a second conductor disposed on the first conductor and arranged in a second direction, a third conductor disposed on the second conductor and arranged in a third direction, a selection element disposed at a portion between the first and second conductors where the first, second, and third conductors intersect, and a memory element disposed at a portion between the second and third conductors where the first, second, and third conductors intersect.

14 Claims, 12 Drawing Sheets

【FIG. 1】
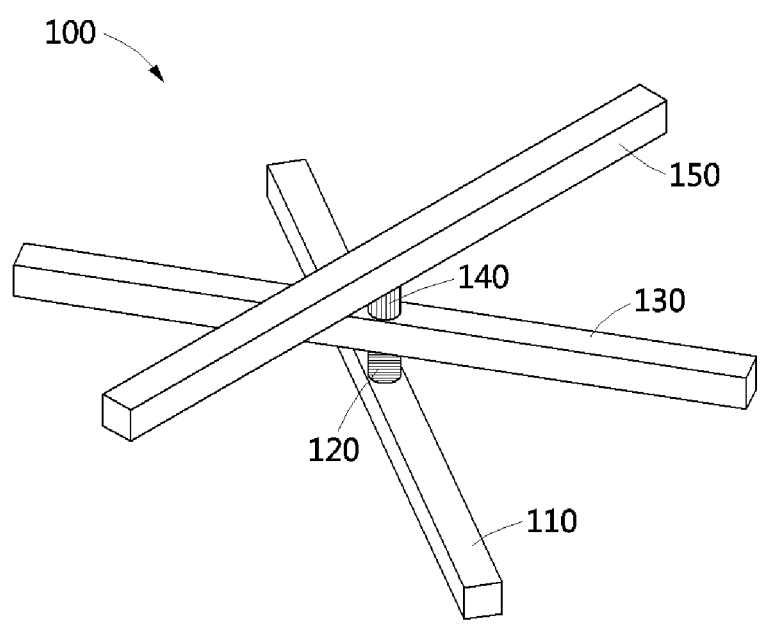

[FIG. 2]
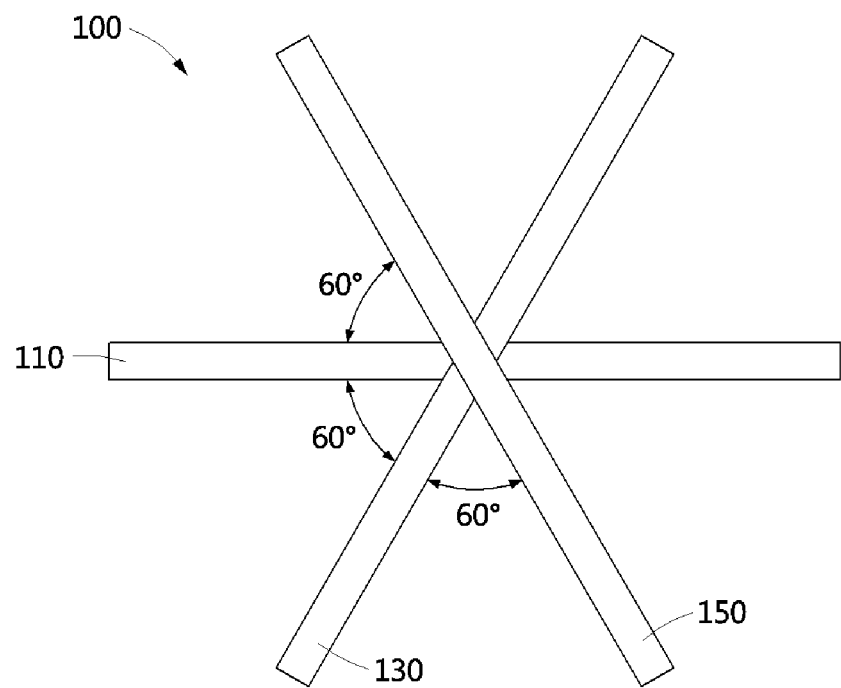

[FIG. 3]
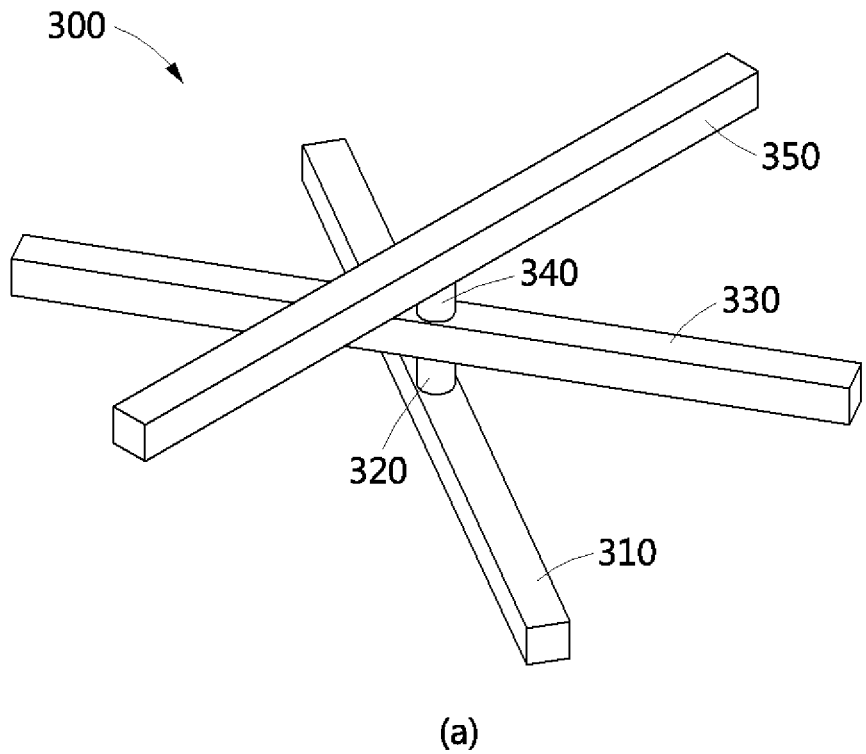
(a)
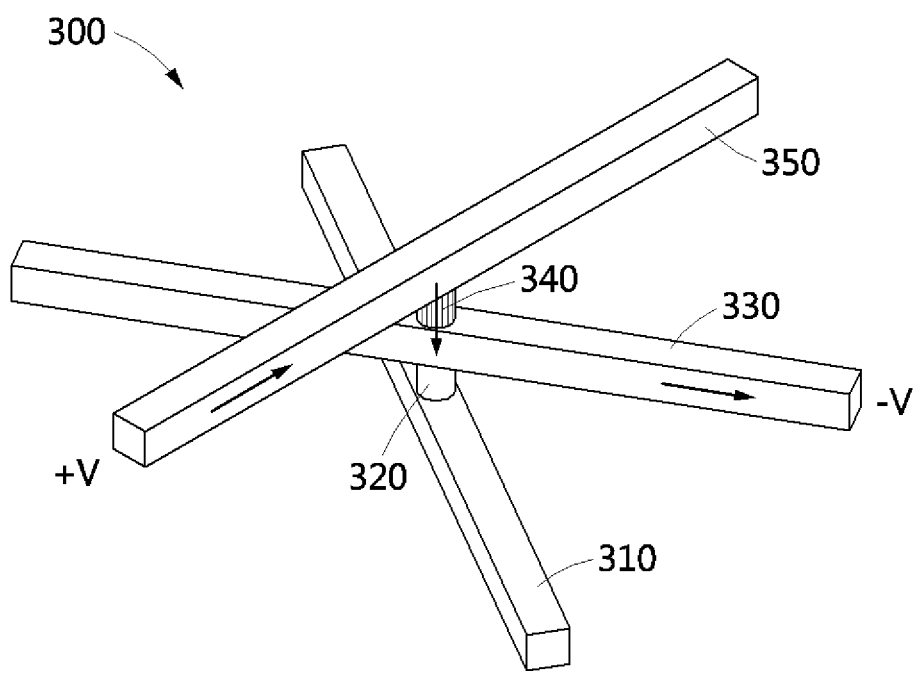
(b)

[FIG. 4]
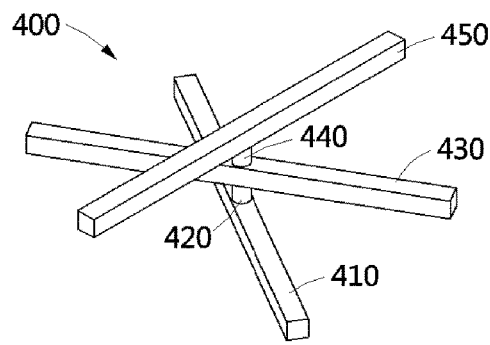
(a)
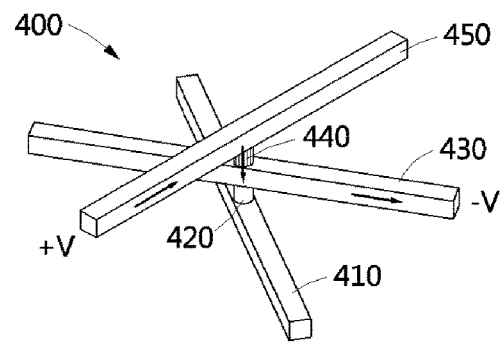
(b)
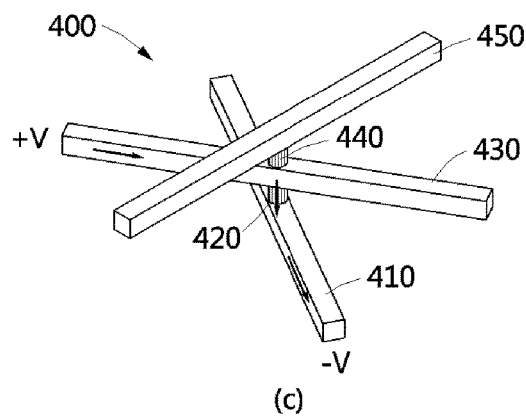
(c)
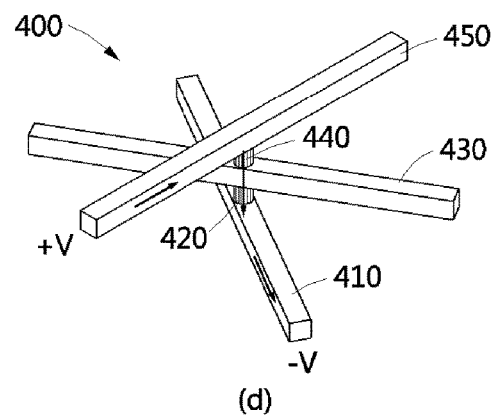
(d)

[FIG. 5]
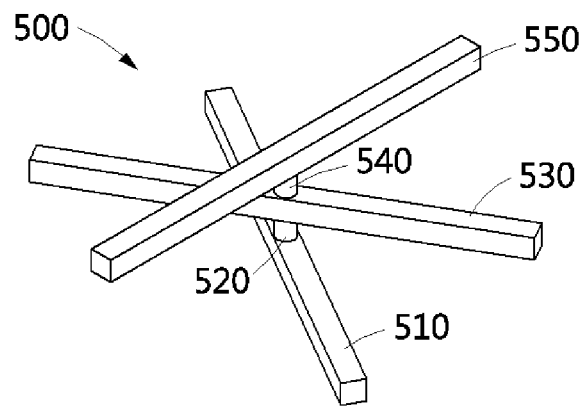
(a)
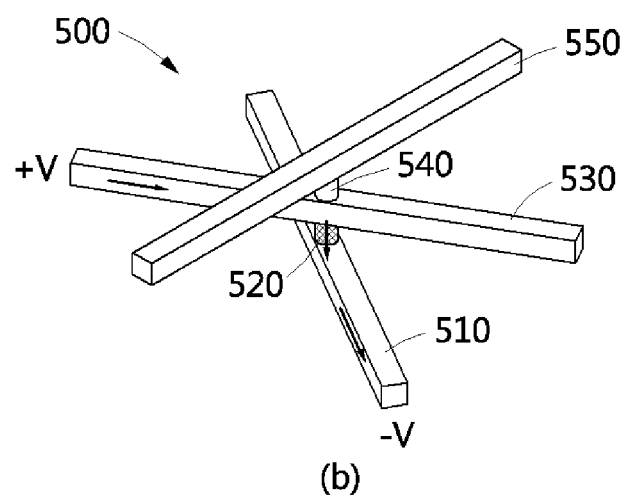
(b)
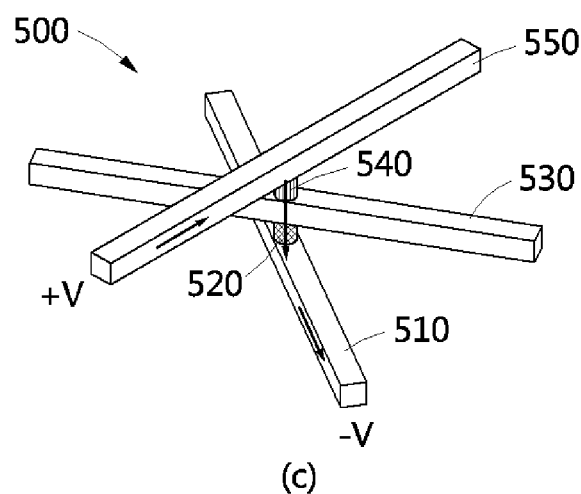
(c)

[FIG. 6]
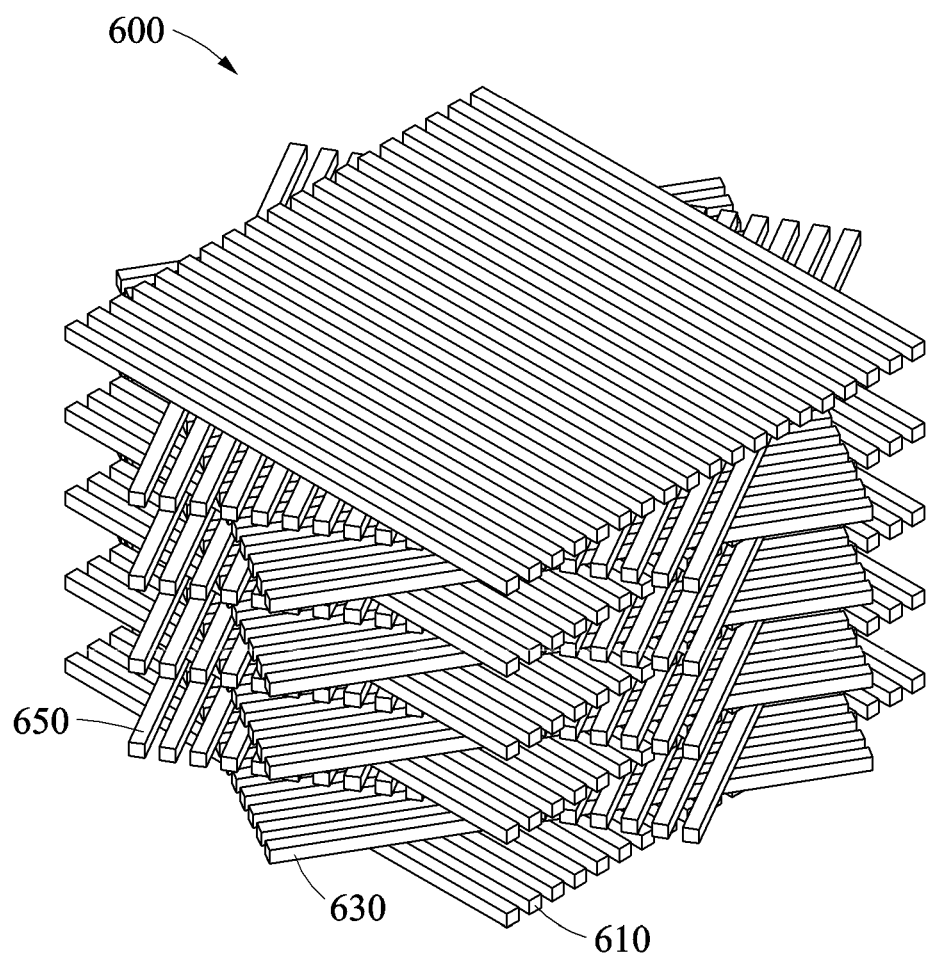

[FIG. 7]
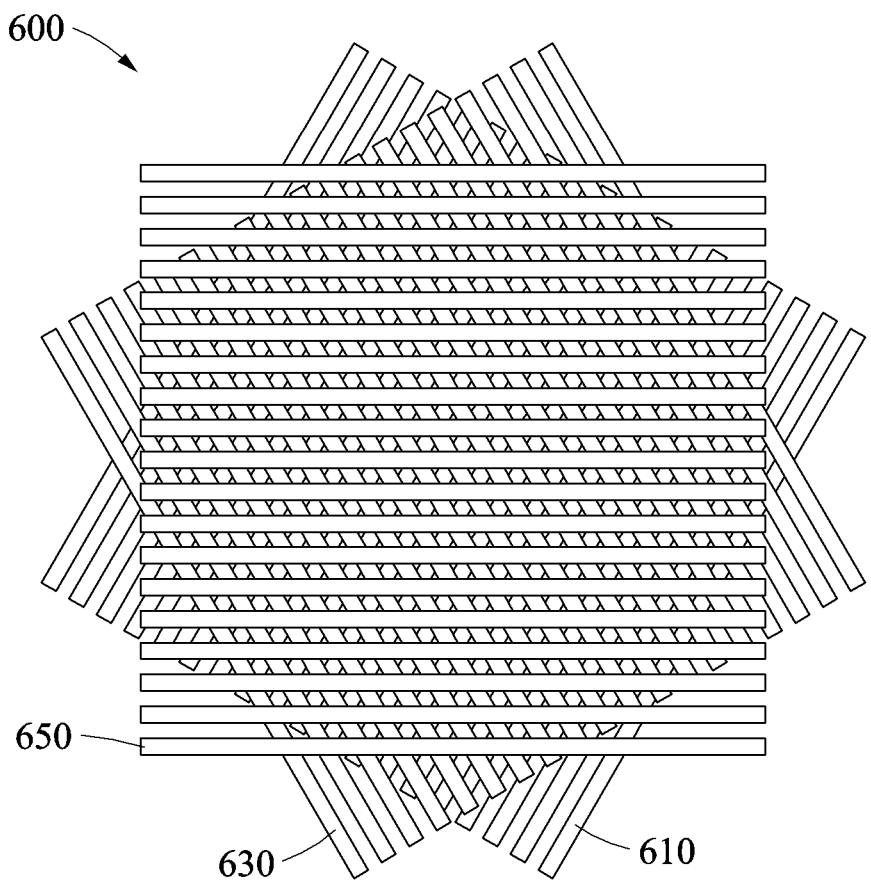

[FIG. 8]
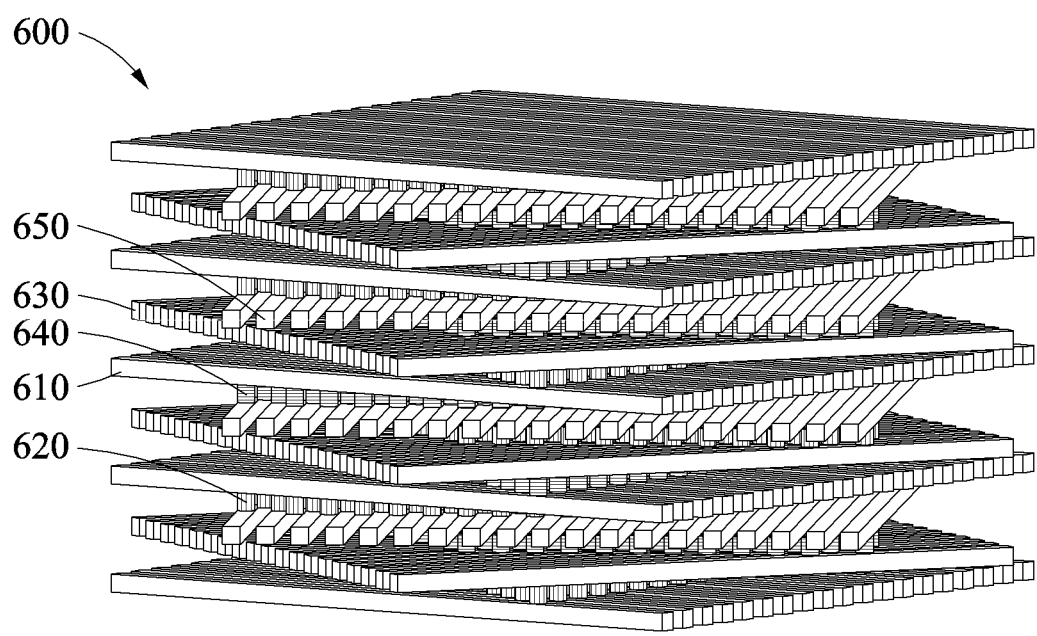

[FIG. 9]
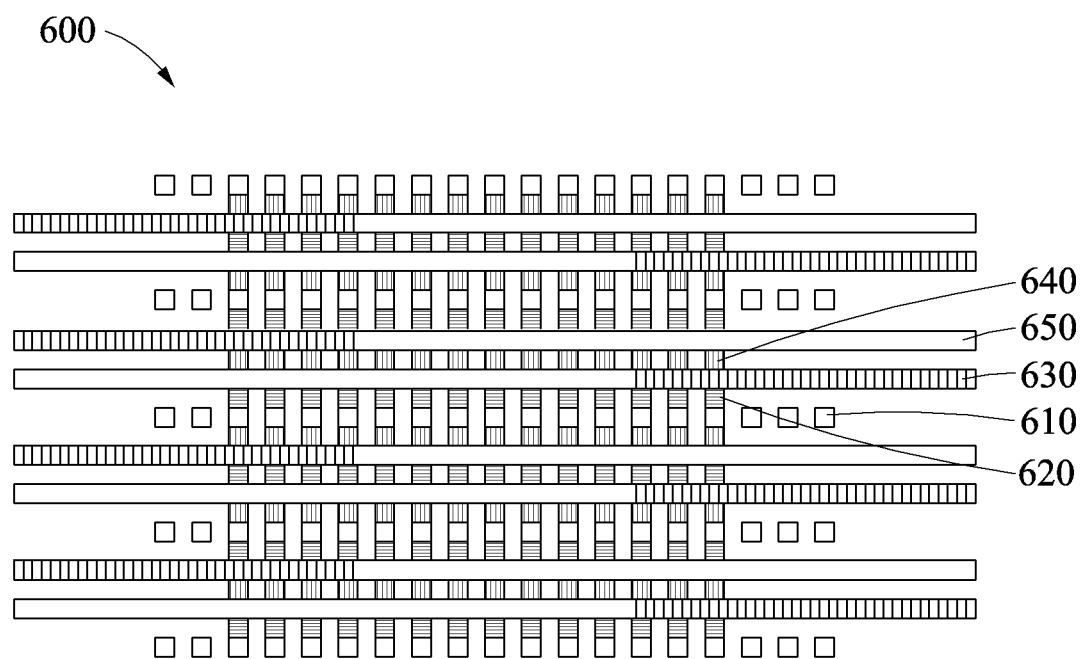

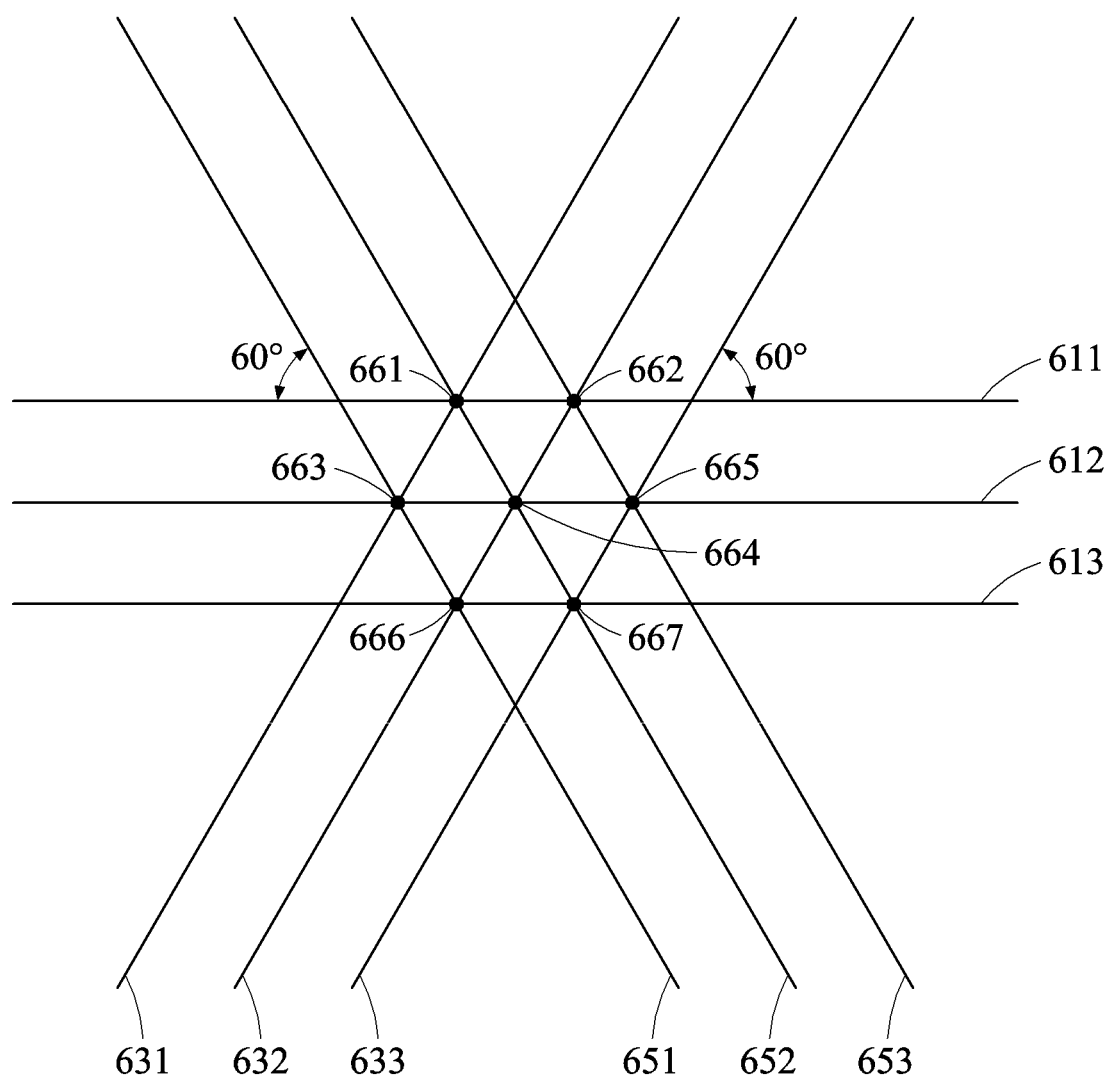
[FIG. 10]

[FIG. 11]
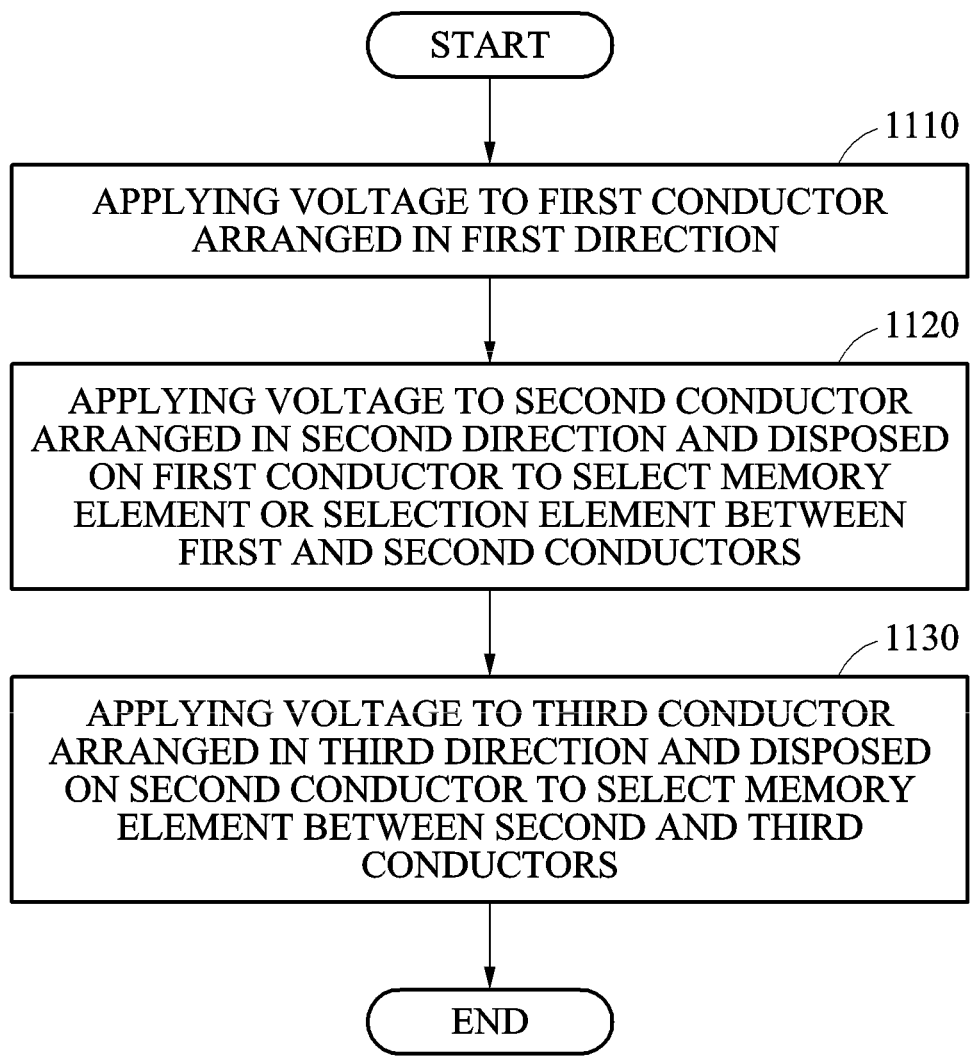

[FIG. 12]
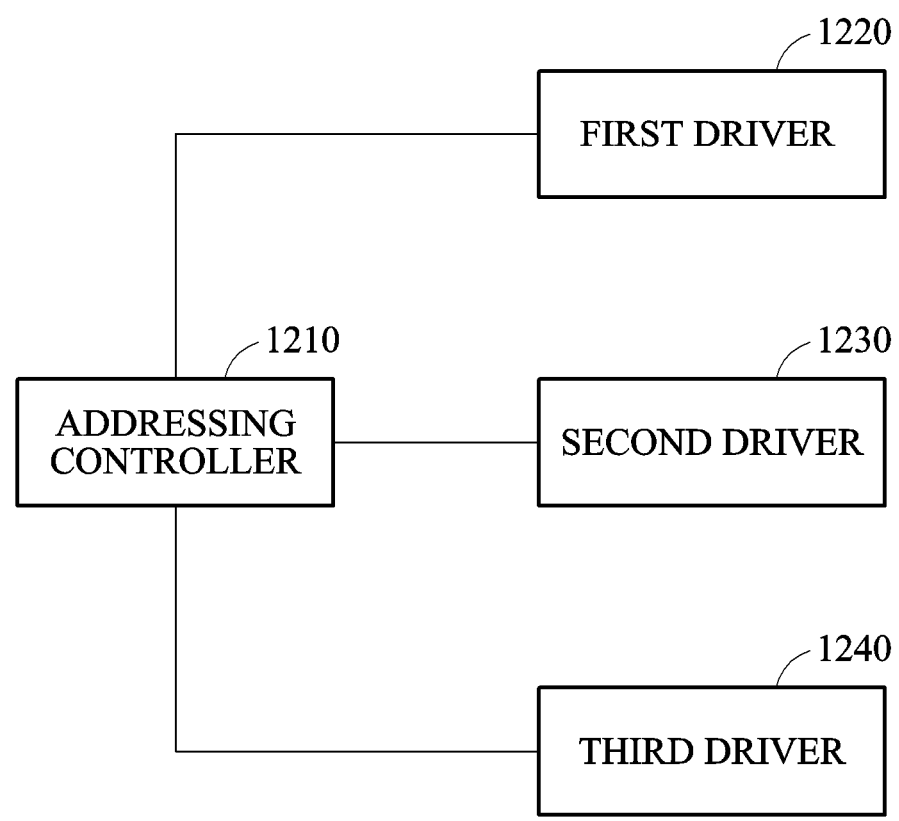

US 11,004,903 B2

ELECTRONIC DEVICE HAVING HEXAGONAL STRUCTURE AND ADDRESSING METHOD THEREFOR

This research was supported by the MOTIE (Ministry of Trade, Industry & Energy (project number 10080625), KSRC (Korea Semiconductor Research Consortium) support program for the development of the future semiconductor device, and the MSIP (Ministry of Science, ICT, and Future Planning), Korea, under the "Mid-career Researcher Program" (NRF-2016R1A2B2014612) supervised by the NRF (National Research Foundation).

CROSS-REFERENCE TO RELATED APPLICATION

This application claims priority to Korean Patent Application No. 10-2018-0054826, filed on May 14, 2018 in the Korean Intellectual Property Office, the disclosure of which is incorporated herein by reference.

BACKGROUND OF THE DISCLOSURE

Field of the Disclosure

The present disclosure relates to an electronic device having a hexagonal structure, and more particularly, to an electronic device having an array of a hexagonal structure and an addressing method therefor. For example, the array may be composed of conductors, and elements arranged between the conductors may be a memory element, a switching element, a selection element, a sensing element, a detection element or a display element.

Description of the Related Art

In general, an electronic device may be fabricated as a single chip by integrating several independent elements.

For example, 3D stacking is essential in a memory device to drive highly integrated memory elements.

In this case, access methods may be roughly classified into two methods, i.e., Xpoint access and vertical access. In Xpoint access, the problem of sneak current may be solved through a selector and the degree of cell integration may be increased. However, there is a disadvantage that the method of designing the device architecture is difficult. On the other hand, in vertical access, there is a problem that a selector (selection element) is difficult to be included in a structure.

In addition, in Xpoint access, a memory is operated by vertically crossing electrodes through square packing. In this case, since there is no separate electrode between a selector and a memory, a volatile selector such as an ovonic threshold switch (OTS), the resistance of which changes momentarily according to voltage application, must be used. In this case, since the memory and the selector are connected in series, the selector must have a significantly higher resistance than the memory for normal operation of the selector.

For this reason, the material selection of the memory and the selector is limited. In addition, when the memory is in an amorphous state, the selector may not be driven properly.

RELATED DOCUMENTS

Patent Documents

Korean Patent Application Publication No. 10-2013-0107326, "TRANSISTOR DRIVEN 3D MEMORY" (Oct. 1, 2013)

SUMMARY OF THE DISCLOSURE

Therefore, the present disclosure has been made in view of the above problems, and it is an object of the present disclosure to provide an electronic device having a hexagonal structure satisfying symmetry and a laminated array structure capable of performing addressing of the same or different elements to maximize the degree of integration.

For example, the present disclosure provides a memory device that reduces line leakage.

For example, the present disclosure provides a memory device having a structure including an electrode between a memory and a selection element and capable of performing independent addressing of the memory and the selection element.

For example, the present disclosure provides a memory device capable of realizing a memory element capable of being integrated with a selection element using a phase-change material.

For example, the present disclosure provides a memory device capable of widening a selection range of materials for a selection element.

For example, the present disclosure provides a plasmonic device that senses target analytes, biomolecules, or detects optical signals.

For example, the present disclosure provides an addressing method for an electronic device having a hexagonal structure.

One aspect of the present disclosure provides an electronic device including a first conductor arranged in a first direction; a second conductor disposed on the first conductor and arranged in a second direction; a third conductor disposed on the second conductor and arranged in a third direction; a selection element disposed at a portion between the first and second conductors where the first, second, and third conductors intersect; and a memory element disposed at a portion between the second and third conductors where the first, second, and third conductors intersect.

The first, second, and third directions may be determined so that the first, second, and third conductors are separately arranged on each axis of a hexagonal structure.

The first, second, and third conductors may be a word line, a selection line, and a bit line, respectively.

The selection element and the memory element may be formed of chalcogenide compound materials.

Another aspect of the present disclosure provides an electronic device including a first conductor arranged in a first direction; a second conductor disposed on the first conductor and arranged in a second direction; a third conductor disposed on the second conductor and arranged in a third direction; a first memory element disposed at a portion between the first and second conductors where the first, second, and third conductors intersect; and a second memory element disposed at a portion between the second and third conductors where the first, second, and third conductors intersect.

Still another aspect of the present disclosure provides an electronic device including first conductors arranged parallel to each other in a first direction; second conductors disposed on the first conductors and arranged parallel to each other in a second direction; third conductors disposed on the second conductors and arranged parallel to each other in a third direction; a plurality of unit elements composed of memory elements or selection elements disposed at portions between the first and second conductors where the first, second, and third conductors intersect; and a plurality of unit elements composed of memory elements or selection elements disposed at portions between the second and third conductors where the first, second, and third conductors intersect.

The first, second, and third directions may be determined so that the first, second, and third conductors are separately arranged on each axis of a hexagonal structure.

The first, second, and third conductors may be word lines, selection lines, or bit lines.

The memory elements or the selection elements constituting the unit elements may be formed of chalcogenide compounds materials.

Yet another aspect of the present disclosure provides an addressing method for an electronic device including a step of applying a voltage to a first conductor arranged in a first direction; a step of applying a voltage to a second conductor arranged in a second direction and disposed on the first conductor to select a memory element or a selection element between the first and second conductors; a step of applying a voltage to a third conductor arranged in a third direction and disposed on the second conductor to select a memory element between the second and third conductors.

Yet another aspect of the present disclosure provides an electronic device including word lines arranged parallel to each other in a first direction; selection lines disposed on the word lines, arranged parallel to each other in a second direction, and selecting a specific element; bit lines disposed on the selection lines and arranged parallel to each other in a third direction; an addressing controller for controlling application of a voltage to the word lines, the selection lines, and the bit lines to control addressing of first elements disposed between the word lines and the selection lines or addressing of second elements disposed between the selection lines and the bit lines.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates an electronic device according to one embodiment of the present disclosure;

FIG. 2 is a top view of an electronic device according to one embodiment of the present disclosure;

FIG. 3 includes drawings for explaining an addressing method for an electronic device according to one embodiment of the present disclosure;

FIG. 4 includes drawings for explaining an addressing method for an electronic device according to one embodiment of the present disclosure;

FIG. 5 includes drawings for explaining an addressing method for an electronic device according to one embodiment of the present disclosure;

FIG. 6 illustrates an electronic device according to one embodiment of the present disclosure;

FIG. 7 is a top view of an electronic device according to one embodiment of the present disclosure;

FIG. 8 is a side view of an electronic device according to one embodiment of the present disclosure;

FIG. 9 is a front view of an electronic device according to one embodiment of the present disclosure;

FIG. 10 is a schematic top view of an electronic device according to one embodiment of the present disclosure;

FIG. 11 is a flowchart for explaining an addressing method for an electronic device according to one embodiment of the present disclosure; and FIG. 12 shows an example of the configuration of an addressing device according to one embodiment.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

In addition, terms such as "first" and "second" are used herein merely to describe a variety of constituent elements, but the constituent elements are not limited by the terms. The terms are used only for the purpose of distinguishing one constituent element from another constituent element.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

FIG. 1 illustrates an electronic device according to one embodiment of the present disclosure.

FIG. 2 is a top view of an electronic device according to one embodiment of the present disclosure.

Referring to FIGS. 1 and 2, a unit element 100 includes a first conductor 110, a second conductor 130, a third conductor 150, a first element 120, and a second element 140.

In this case, the first element 120 may be a selection element, and the second element 140 may be a memory element. Hereinafter, for convenience of explanation, the first element 120 may be referred to as a selection element, and the second element 140 may be referred to as a memory element. In addition, an electronic device characterized in that the selection element or the memory element is disposed between conductors may be referred to as a memory device.

Referring to FIGS. 1 and 2, the first, second, and third conductors 110, 130, and 150 may be arranged in the first, second, and third directions, respectively.

In this case, the first, second, and third directions may be determined so that the first, second, and third conductors 110, 130, and 150 are separately arranged on each axis of a hexagonal structure.

For example, the first and second directions may form an angle of 60° based on an internal angle, and the second and third directions may form an angle of 60° based on an internal angle.

The first, second, and third conductors 110, 130, and 150 may be electrodes.

The first conductor 110 may be a word line.

The second conductor 130 may be a selection line.

The third conductor 150 may be a bit line.

Alternatively, each of the first, second, and third conductors 110, 130, and 150 may be a word line, a selection line, or a bit line.

The first conductor 110 is disposed in the first direction.

The selection element 120 is disposed on the first conductor 110.

The second conductor 130 is disposed on the selection element 120.

The second conductor 130 may be disposed in the second direction so that the second conductor 130 and the first conductor 110 form an angle of 60° based on an internal angle.

The memory element 140 is disposed on the second conductor 130.

The memory element 140 may be a memory cell.

The third conductor 150 is disposed on the memory element 140.

The third conductor 150 may be disposed in the third direction so that the third and second conductors 150 and 130 form an angle of 60° based on an internal angle and the third and first conductors 150 and 110 form an angle of 60° based on an internal angle.

The selection element 120 and the memory element 140 may be disposed to be perpendicular to each of the first, second, and third conductors 110, 130, and 150.

That is, the selection element 120 and the memory element 140 may be disposed at portions between the first, second, and third conductors 110, 130, and 150 where the first, second, and third conductors 110, 130, and 150 intersect.

The selection element 120 may be an element having threshold characteristics.

At voltages below a threshold voltage, the element having threshold characteristics is in a high resistance state (HRS), which causes a very small amount of current flow. On the other hand, at voltages exceeding the threshold voltage, the element is in a low resistance state (LRS), which causes a sudden current rise.

The selection element 120 may be an element having threshold characteristics such as a mixed ionic-electronic conduction (MIEC) selector, an insulator-metal transition (IMT) selector, a tunnel barrier switch, a field-assisted superlinear threshold (FAST) selector, or an ovonic threshold switch (OTS).

The MIEC selector may be formed of copper (Cu) or the like.

The IMT selector may be formed of $NbO_x$, $VO_x$, or the like.

The tunnel barrier switch may be formed of TaO, TiO, TaO, or the like.

The OTS may be formed of chalcogenide compound materials such as Ge—Sb—Te, Ge—Te, Si—Te, or A-B—Te.

Here, each of A and B may be copper (Cu), silver (Ag), gold (Au), zinc (Zn), boron (B), aluminum (Al), indium (In), carbon (C), silicon (Si), germanium (Ge), tin (Sn), nitrogen (N), phosphorus (P), arsenic (As), antimony (Sb), or the like.

In addition, the OTS may be doped with Si or the like.

For example, the OTS may be formed of Si-doped $GeTe_6$.

Here, hyphenated chemical compositions represent elements contained in a particular compound and may represent all chemical structures including the indicated elements.

For example, Ge—Sb—Te may be $Ge_2Sb_2Te_5$, $Ge_2Sb_2Te_7$, $Ge_1Sb_2Te_4$, $Ge_1Sb_4Te_7$, or the like.

For example, Ge—Te may be $GeTe_4$, $GeTe_6$, or the like.

For example, Si—Te may be $SiTe_3$, $SiTe_4$, $SiTe_6$, or the like.

In addition, the OTS may have various chemical compositions.

The memory element 140 may be formed of chalcogenide compound materials, a phase-change material (PCM), $TiO_2$, $HfO_2$, or the like.

For example, the memory element 140 may be a laminated memory element such as phase-change random access memory (PRAM) and resistive random access memory (ReRAM).

As voltages applied via conductors, changes in material properties of the element may cause not only electrical properties such as resistance, but also other changes such as optical properties.

For example, dielectric constant and refractive index of an element consists of chalcogenide compound materials may be changed. Changes of dielectric constant and refractive index may cause changes of plasmonic effects, which may have potentials to be applied for plasmonic devices.

For example, the memory element and selection element may be used for sensing and detection elements for an active plasmonic device.

For example, sensing and detection of target analyte, biomolecule, and optical signals may be controllable via an active plasmonic device with applying voltages.

A voltage may be applied to the first, second, and third conductors 110, 130, and 150.

The first, second, and third conductors 110, 130, and 150 may turn on or turn off the selection element 120 or the memory element 140 disposed therebetween.

The positions of the selection element 120 and the memory element 140 may be interchanged.

That is, the memory element 140 may be disposed between the first and second conductors 110 and 130, and the selection element 120 may be disposed between the second and third conductors 130 and 150.

Alternatively, the selection element 120 may be replaced by a memory element.

That is, the first memory element may be disposed between the first and second conductors 110 and 130, and the second memory element may be disposed between the second and third conductors 130 and 150.

The first and second memory elements may be memory cells.

Alternatively, each of the first and second memory elements may include a memory cell and a selection element.

That is, each of the first and second memory elements may include a memory cell and a selection element connected in series.

That is, an element including a memory cell and a selection element connected in series may be disposed between the first and second conductors 110 and 130, and an element including a memory cell and a selection element connected in series may be disposed between the second and third conductors 130 and 150.

The memory device 100 may further include an addressing device (not shown).

The addressing device may turn on the memory element or the selection element by applying a voltage to the first, second, and third conductors 110, 130, and 150 and may perform a read operation or a write operation.

The memory device according to one embodiment of the present disclosure has the above-described structure. Thus, when the memory device is used, the selection range of the selection element may be widened.

In addition to an ovonic threshold switching (OTS) selection element, a phase-change selection element may be used.

In addition to a volatile selection element, a non-volatile selection element may be used.

In addition, when a memory device including a memory cell and a selection element is realized, the memory device may be realized using a 3D lamination method with less line leakage.

In addition, a memory structure having a higher degree of integration than that of a conventional 3D memory structure may be realized.

FIG. 3 includes drawings for explaining an addressing method for an electronic device according to one embodiment of the present disclosure.

As shown in (a) of FIG. 3, a memory device 300 may include a first conductor 310, a first memory element 320, a second conductor 330, a second memory element 340, and a third conductor 350.

The first and second memory elements 320 and 340 may be disposed between the first, second, and third conductors 310, 330, and 350, respectively.

As shown in (b) of FIG. 3, in the memory device 300, a voltage may be applied to the second and third conductors 330 and 350 so that a read operation or a write operation may be performed in the second memory element 340.

FIG. 4 includes drawings for explaining an addressing method for an electronic device according to one embodiment of the present disclosure.

Referring to FIG. 4, a memory device 400 may operate as a multi-level cell.

As shown in (a) of FIG. 4, the memory device 400 may include a first conductor 410, a first memory element 420, a second conductor 430, a second memory element 440, and a third conductor 450.

As shown in (b) of FIG. 4, in the memory device 400, a voltage may be applied to the second and third conductors 430 and 450 so that read or write may be performed only in the second memory element 440.

As shown in (c) of FIG. 4, in the memory device 400, a voltage may be applied to the first and second conductors 410 and 430 so that read or write may be performed only in the first memory element 420.

As shown in (d) of FIG. 4, in the memory device 400, a voltage may be applied to the first and third conductors 410 and 450 so that read or write may be performed in the first and second memory elements 420 and 440.

FIG. 5 includes drawings for explaining an addressing method for an electronic device according to one embodiment of the present disclosure.

As shown in (a) of FIG. 5, an electronic device 500 may include a first conductor 510, a memory element 520, a second conductor 530, a selection element 540, and a third conductor 550.

As shown in (b) of FIG. 5, in the electronic device 500, a voltage may be applied to the first and second conductors 510 and 530 so that the selection element 540 may be turned on.

As shown in (c) of FIG. 5, in the electronic device 500, a voltage may be applied to the first and third conductors 510 and 550 so that the memory element 520 may also be turned on and read or write may be performed.

The positions of the memory element 520 and the selection element 540 may be interchanged.

In this case, in the electronic device 500, a voltage may be applied to the second and third conductors 530 and 550 so that the selection element 540 may be turned on.

In addition, in the electronic device 500, a voltage may be applied to the first and third conductors 510 and 550 so that the memory element 520 may also be turned on and read or write may be performed.

FIG. 6 illustrates an electronic device according to one embodiment of the present disclosure.

FIG. 7 is a top view of an electronic device according to one embodiment of the present disclosure.

FIG. 8 is a side view of an electronic device according to one embodiment of the present disclosure.

FIG. 9 is a front view of an electronic device according to one embodiment of the present disclosure.

The electronic device shown in FIGS. 6 to 9 may include a plurality of the memory devices described with reference to FIGS. 1 to 5 as a unit element.

Referring to FIG. 7, first conductors 610, second conductors 630, and third conductors 650 may be arranged in the first, second, and third directions, respectively.

In this case, the first, second, and third directions may be determined so that the top view observed when the first, second, and third conductors 610, 630, and 650 are arranged is hexagonal.

For example, in the hexagonal close-packed crystal structure, Miller-Bravais indices may be [1000] for the first direction, [0100] for the second direction, and [0010] for the third direction.

Referring to FIGS. 6 to 9, a memory device 600 may include the first conductors 610, the second conductors 630, the third conductors 650, selection elements 620, and memory elements 640.

The first conductors 610 may be bit lines.

The second conductors 630 may be selection lines.

The third conductors 650 may be word lines.

The first conductors 610 are arranged in parallel with each other.

The first conductors 610 may form a plane.

The second conductors 630 are arranged in parallel with each other.

The second conductors 630 may form a plane.

The third conductors 650 are arranged in parallel with each other.

The third conductors 650 may form a plane.

Alternatively, each of the first, second, and third conductors 610, 630, and 650 may be a bit line, a selection line, or a word line.

Alternatively, when elements are laminated on or under the first, second, and third conductors 610, 630, and 650, the first, second, and third conductors 610, 630, and 650 may be bit lines in consideration of the relationship with the elements disposed thereon and may be word lines in consideration of the relationship with the elements disposed thereunder.

For example, the elements disposed on or under the conductors may be memory elements.

The first, second, and third conductors 610, 630, and 650 may be repeatedly laminated.

The first conductors 610 may be disposed so that the first and second conductors 610 and 630 form an angle of 60° based on an internal angle.

The second conductors 630 may be disposed so that the second and third conductors 630 and 650 form an angle of 60° based on an internal angle.

Selection elements may be disposed at portions between the first and second conductors 610 and 630 where the first and second conductors 610 and 630 intersect.

Memory elements may be disposed at portions between the second and third conductors 630 and 650 where the second and third conductors 630 and 650 intersect.

The selection elements 620 and memory elements 640 may be formed of chalcogenide compound materials.

A voltage may be applied to the first, second, and third conductors 610, 630, and 650.

The first, second, and third conductors 610, 630, and 650 may turn on or turn off the selection elements 620 or the memory elements 640 disposed therebetween.

The positions of the selection elements 620 and the memory elements 640 may be interchanged.

That is, the memory elements 640 may be disposed between the first and second conductors 610 and 630, and the selection elements 620 may be disposed between the second and third conductors 630 and 650.

Alternatively, the selection elements 620 may be replaced by memory elements.

That is, first memory elements may be disposed between the first and second conductors 610 and 630, and second memory elements may be disposed between the second and third conductors 630 and 650.

The first and second memory elements may be memory cells.

Alternatively, each of the first and second memory elements may include memory cells and selection elements.

That is, each of the first and second memory elements may be elements including a memory cell and a selection element connected in series.

That is, elements including a memory cell and a selection element connected in series may be disposed between the first and second conductors 610 and 630, and elements including a memory cell and a selection element connected in series may be disposed between the second and third conductors 630 and 650.

The memory device 600 may further include an addressing device (not shown).

The addressing device may turn on specific memory elements or specific selection elements by applying a voltage to the first, second, and third conductors 610, 630, and 650 and may perform a read operation or a write operation.

In the memory device 600 shown in FIGS. 6 to 9, the unit structure composed of the first conductors 610, the selection elements 620, the second conductors 630, the memory elements 640, and the third conductors 650 is laminated in six layers. However, the unit structure may be laminated in one or more layers as required.

Referring to FIG. 7, it can be seen that, when the memory device is viewed from above, the memory device has a hexagonal structure.

FIG. 10 is a schematic top view of an electronic device according to one embodiment of the present disclosure.

Referring to FIG. 10, first conductors 611, 612, and 613 are arranged parallel to each other.

Second conductors 621, 622, and 623 are arranged parallel to each other.

Third conductors 631, 632, and 633 are arranged parallel to each other.

Memory elements, selection elements, or memory elements may be disposed at portions 661, 662, 663, 664, 665, 666, and 667 where the first conductors 611, 612, and 613, the second conductors 621, 622, and 623, and the third conductors 631, 632, and 633 intersect.

FIG. 11 is a flowchart for explaining an addressing method for an electronic device according to one embodiment of the present disclosure.

Referring to FIG. 11, in step S1110, the addressing device applies a voltage to a first conductor arranged in the first direction.

In step S1120, the addressing device selects a memory element or a selection element between the first conductor and a second conductor by applying a voltage to the second conductor arranged in the second direction and disposed on the first conductor.

In step S1130, the addressing device selects a memory element between the second conductor and a third conductor by applying a voltage to the third conductor arranged in the third direction and disposed on the second conductor.

The addressing method for an electronic device and the addressed memory device shown in FIG. 11 are the same as the memory device and the addressing method for a memory device described with reference to FIGS. 1 to 10, and thus a detailed description thereof will be omitted.

FIG. 12 shows an example of the configuration of an addressing device according to one embodiment.

Referring to FIG. 12, the addressing device may include an addressing controller 1210, a first driver 1220, a second driver 1230, and a third driver 1240.

The addressing device shown in FIG. 12 may be connected to the memory device of FIGS. 1 to 5 or the memory device of FIGS. 6 to 9.

The addressing controller 1210 may control the first, second, and third drivers 1220, 1230, and 1240 so that a voltage is applied to a specific cell (memory element) or the selection element is driven.

For example, the first driver 1220 may apply a voltage to the first conductor 110 arranged in the first direction shown in FIG. 1 under the control of the addressing controller 1210.

In addition, the first driver 1220 may apply a voltage to the first conductors 610 operating as bit lines shown in FIG. 6 under the control of the addressing controller 1210.

The second driver 1230 may apply a voltage to the second conductor 130 arranged in the second direction shown in FIG. 1 under the control of the addressing controller 1210.

In addition, the second driver 1230 may apply a voltage to the second conductors 630 operating as selection lines shown in FIG. 6 under the control of the addressing controller 1210.

The third driver 1240 may apply a voltage to the third conductor 150 arranged in the third direction shown in FIG. 1 under the control of the addressing controller 1210.

In addition, the third driver 1240 may apply a voltage to the third conductors 650 operating as word lines shown in FIG. 6 under the control of the addressing controller 1210.

Therefore, the memory device according to one embodiment includes the first conductors 611, 612, and 613 arranged parallel to each other in the first direction and operating as word lines; the second conductors 621, 622, and 623 disposed on the first conductors, arranged parallel to each other in the second direction, and operating as selection lines for selecting a specific element; the third conductors 631, 632, and 633 disposed on the second conductors, arranged parallel to each other in the third direction, and operating as bit lines; and the addressing controller 1210 for controlling application of a voltage to the word lines, the selection lines, and the bit lines.

In this case, the addressing controller 1210 controls addressing of the first elements disposed between the word lines and the selection lines or the second elements disposed between the selection lines and the bit lines.

The first and second elements may have the same function or may have different functions.

When the first and second elements are memory elements having the same function, multi-level cell addressing may be performed by addressing according to one embodiment.

When the first and second elements have different functions, single-level cell addressing may be performed by addressing according to one embodiment.

Each of the first and second elements may be memory elements, switching elements, selection elements, sensing elements, detection elements or display elements.

The memory device according to one embodiment of the present disclosure has a hexagonal laminated structure.

The memory device according to one embodiment of the present disclosure has a hexagonal structure satisfying symmetry and a laminated array structure capable of performing addressing of the same or different elements to maximize the degree of integration.

The memory device according to one embodiment of the present disclosure can minimize line leakage current.

The memory device according to one embodiment of the present disclosure has a structure including an electrode between a memory and a selection element and can perform independent addressing of the memory and the selection element.

The memory device according to one embodiment of the present disclosure can implement a memory element capable of being integrated with a selection element using a phase-change material.

The memory device according to one embodiment of the present disclosure can widen a selection range of materials for a selection element.

The addressing method according to one embodiment of the present disclosure can be applied to perform addressing of a hexagonal memory device.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. An electronic device, comprising:
a first conductor arranged in a first direction;
a second conductor disposed on the first conductor and arranged in a second direction;
a third conductor disposed on the second conductor and arranged in a third direction;
a selection element disposed at a portion between the first and second conductors where the first, second, and third conductors intersect; and
a memory element disposed at a portion between the second and third conductors where the first, second, and third conductors intersect,
wherein the first, second, and third conductors are a word line, a selection line, and a bit line, respectively.

2. The electronic device according to claim 1, wherein the first, second, and third directions are determined so that the first, second, and third conductors are separately arranged on each axis of a hexagonal structure.

3. The electronic device according to claim 1, wherein the selection element and the memory element are formed of chalcogenide compound materials.

4. An electronic device, comprising:
a first conductor arranged in a first direction;
a second conductor disposed on the first conductor and arranged in a second direction;
a third conductor disposed on the second conductor and arranged in a third direction;
a first memory element disposed at a portion between the first and second conductors where the first, second, and third conductors intersect; and
a second memory element disposed at a portion between the second and third conductors where the first, second, and third conductors intersect.

5. The electronic device according to claim 4, wherein the first, second, and third directions are determined so that the first, second, and third conductors are separately arranged on each axis of a hexagonal structure.

6. The electronic device according to claim 4, wherein each of the memory elements comprises a memory cell and a selection element.

7. The electronic device according to claim 4, wherein the first and second memory elements are formed of chalcogenide compound materials.

8. An electronic device, comprising:
first conductors arranged parallel to each other in a first direction;

second conductors disposed on the first conductors and arranged parallel to each other in a second direction;

third conductors disposed on the second conductors and arranged parallel to each other in a third direction;

a plurality of unit elements composed of first memory elements or first selection elements disposed at portions between the first and second conductors where the first, second, and third conductors intersect; and the plurality of unit elements composed of second memory elements or second selection elements disposed at portions between the second and third conductors where the first, second, and third conductors intersect, when elements are laminated on or under the first, second, and third conductors, the first, second, and third conductors are bit lines in consideration of relationship with the elements disposed thereon and are word lines in consideration of relationship with the elements disposed thereunder.

9. The electronic device according to claim 8, wherein the first, second, and third directions are determined so that a top view of memory the electronic device is hexagonal.

10. The electronic device according to claim 8, wherein the first, second, and third directions are determined so that a top view observed when the first, second, and third conductors are arranged is hexagonal.

11. The electronic device according to claim 8, wherein the first, second, and third conductors are word lines, selection lines, or bit lines.

12. The electronic device according to claim 8, wherein the first memory elements, the second memory elements, the first selection elements, and the second selection elements are formed of chalcogenide compound materials.

13. An addressing method for an electronic device, comprising:

applying a voltage to a first conductor arranged in a first direction;

applying a voltage to a second conductor arranged in a second direction and disposed on the first conductor to select a memory element or a selection element between the first and second conductors; and applying a voltage to a third conductor arranged in a third direction and disposed on the second conductor to select a memory element between the second and third conductors, wherein the first, second, and third conductors are a word line, a selection line, and a bit line, respectively.

14. The addressing method according to claim 13, wherein the first, second, and third directions are determined so that a top view observed when the first, second, and third conductors are arranged is hexagonal.

* * * * *